United States Patent
Jennings et al.

(10) Patent No.: US 8,316,867 B2
(45) Date of Patent: Nov. 27, 2012

(54) ELECTROSTATIC CHUCK CLEANING DURING SEMICONDUCTOR SUBSTRATE PROCESSING

(75) Inventors: Dean C. Jennings, Beverly, MA (US); Majeed Foad, Sunnyvale, CA (US); Jonathan Simmons, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 13/189,811

(22) Filed: Jul. 25, 2011

(65) Prior Publication Data

US 2011/0277932 A1    Nov. 17, 2011

Related U.S. Application Data

(62) Division of application No. 11/470,772, filed on Sep. 7, 2006, now Pat. No. 7,993,465.

(51) Int. Cl.
   *B08B 5/00* (2006.01)

(52) U.S. Cl. ....... 134/84; 134/88; 134/137; 414/222.07; 414/222.13; 414/225.01; 414/226.05; 414/744.1; 414/749.1

(58) Field of Classification Search ............ 134/137; 414/222.07, 222.13, 225.01, 226.05, 744.1, 414/749.1, 752.1; 156/345.31, 345.32
   See application file for complete search history.

(56) References Cited

U.S. PATENT DOCUMENTS

| | | | |
|---|---|---|---|
| 4,962,049 A | 10/1990 | Chang et al. | |
| 5,075,256 A | 12/1991 | Wang et al. | |
| 5,382,311 A | 1/1995 | Ishikawa et al. | |
| 5,436,790 A * | 7/1995 | Blake et al. | 361/234 |
| 5,507,874 A | 4/1996 | Su et al. | |
| 5,746,928 A | 5/1998 | Yen et al. | |
| 6,059,985 A | 5/2000 | Yoshimura et al. | |
| 6,098,637 A | 8/2000 | Parke | |
| 6,136,211 A | 10/2000 | Qian et al. | |
| 6,179,921 B1 | 1/2001 | Ruffell et al. | |
| 6,207,959 B1 | 3/2001 | Satoh et al. | |
| 6,293,749 B1 | 9/2001 | Raaijmakers et al. | |
| 6,583,018 B1 | 6/2003 | Matsunaga et al. | |

(Continued)

FOREIGN PATENT DOCUMENTS

JP    11254317 A   *   9/1999

OTHER PUBLICATIONS

JP 11-254317, Nishi et al., Derwent abstract; 1999.*

(Continued)

*Primary Examiner* — Michael Kornakov
*Assistant Examiner* — Natasha Campbell
(74) *Attorney, Agent, or Firm* — Diehl Servilla LLC

(57) ABSTRACT

Methods and apparatus for cleaning electrostatic chucks in processing chambers are provided. The process comprises flowing a backside gas comprising a reactive agent into a zone in a process chamber, the zone defined by a space between a surface of an electrostatic chuck or of a cleaning station and a surface of a substrate. The surface of the electrostatic chuck is etched with the reactive agent to remove debris. An apparatus for cleaning an electrostatic chuck is also provided, the apparatus comprising: a process chamber; an elongate arm having a reach disposed through a wall of the process chamber; an electrostatic chuck attached to the elongate arm; a cleaning station located within the reach of the elongate arm; and a reactive gas source that is operatively connected to the cleaning station.

17 Claims, 3 Drawing Sheets

U.S. PATENT DOCUMENTS

| | | | |
|---|---|---|---|
| 6,689,221 B2 | 2/2004 | Ryding et al. | |
| 6,755,934 B2 * | 6/2004 | Matsuoka | 156/345.33 |
| 6,956,223 B2 | 10/2005 | Smick et al. | |
| 6,965,116 B1 | 11/2005 | Wagner et al. | |
| 7,045,020 B2 | 5/2006 | Bhatnagar et al. | |
| 7,591,897 B2 | 9/2009 | Sunkara et al. | |
| 2002/0153024 A1 | 10/2002 | Akiba | |
| 2003/0022513 A1 | 1/2003 | Wu et al. | |
| 2003/0236004 A1 | 12/2003 | Sung et al. | |
| 2005/0045106 A1 | 3/2005 | Boyd et al. | |
| 2005/0066994 A1 | 3/2005 | Biles et al. | |
| 2005/0163598 A1 * | 7/2005 | Yuasa et al. | 414/217 |
| 2005/0164506 A1 | 7/2005 | Chen et al. | |
| 2005/0181584 A1 | 8/2005 | Foad et al. | |
| 2006/0112970 A1 | 6/2006 | Akiba | |
| 2006/0221538 A1 * | 10/2006 | Muramoto et al. | 361/234 |

OTHER PUBLICATIONS

USPTO Final Office Action mailed Mar. 17, 2010, in U.S. Appl. No. 11/470,772, 12 pgs.

USPTO Non-Final Office Action mailed Dec. 9, 2010, in U.S. Appl. No. 11/470,772, 14 pgs.

USPTO Non-Final Office Action mailed Aug. 26, 2009, in U.S. Appl. No. 11/470,772, 21 pgs.

* cited by examiner

ELECTROSTATIC CHUCK CLEANING DURING SEMICONDUCTOR SUBSTRATE PROCESSING

CROSS-REFERENCE TO RELATED APPLICATIONS

This application is a divisional of U.S. patent application Ser. No. 11/470,772, filed on Sep. 7, 2006.

FIELD

Methods of cleaning electrostatic chucks during semiconductor substrate processing are provided. In one aspect, methods and apparatus for cleaning electrostatic chucks of an ion implanter apparatus are provided.

BACKGROUND

Many single-wafer processing systems use substrate holders, such as an electrostatic chuck in combination with a base, to retain a wafer during semi-conductor substrate processing. A backside purge gas, flowing between, for example, the wafer, and the electrostatic chuck (also referred to as an "echuck"), is used to regulate the temperature of the wafer. The backside gas is typically used as a heat transfer medium. As voltage is applied to an electrostatic chuck, a coulomb force holds the wafer in place. In some instances, the coulomb force might be of the Johnson-Rahbek variety. Often, during processing of the wafer, contaminants and/or debris sputter from the wafer and adhere to the electrostatic chuck. Contaminants or debris includes materials that are foreign to the chuck, that is, materials that have come from a source other than the chuck and that interfere with the operation of the chuck when present in sufficient amounts. During ion implantation, for example, organic materials such as photo resist may dislodge from the wafer and adhere to the chuck. During repeated film fabrication process in a process chamber, contaminants will adhere to, and build up on, the electrostatic chuck. These contaminants that adhere to the electrostatic chuck include, primarily, organic materials, etc., that were originally on the semiconductor wafers themselves. When there is a buildup of this type of contaminant, the strength with which the electrostatic chuck is able to chuck and secure the semiconductor wafer is weakened, which may cause the wafer to shift out of position. Thus, the presence of debris on the chuck interferes with chucking and de-chucking of the substrate. Moreover, the build-up of debris on the chuck impacts the ability to maintain a low operating pressure of approximately $10^{-6}$ torr in the ion implantation system.

Typically, when a chuck has become too dirty to effectively retain a wafer, the process must be shut down, so that the chuck can removed and cleaned. Cleaning the chuck generally involves an aggressive cleaning with stripping chemicals, which can reduce the useful life of the chuck. Moreover, shutting down the process itself is disruptive and inefficient, for example, throughput is reduced.

There is a need, therefore, to provide apparatus and methods for cleaning electrostatic chucks that minimize disruption to substrate processing.

SUMMARY

Methods and apparatus for cleaning electrostatic chucks in processing chambers are provided. In one aspect, a process is provided, the process comprising flowing a backside gas comprising a reactive agent into a zone in a process chamber, the zone defined by a space between a surface of an electrostatic chuck and a surface of a substrate; and etching the surface of the electrostatic chuck with the reactive agent to remove debris.

In another aspect of the present invention, a process that comprises moving an electrostatic chuck to a cleaning station within a process chamber, wherein a reactive agent source is operatively connected to the cleaning station; and etching a surface of the electrostatic chuck with a reactive agent to remove debris from the surface is provided.

In a further aspect of the present invention, an apparatus for cleaning an electrostatic chuck is provided, the apparatus comprising: a process chamber; an elongate arm having a reach disposed through a wall of the process chamber; an electrostatic chuck attached to the elongate arm; a cleaning station located within the reach of the elongate arm; and a reactive gas source that is operatively connected to the cleaning station.

BRIEF DESCRIPTION OF THE FIGURES

The teachings of the present invention can be readily understood by considering the following detailed description in conjunction with the accompanying drawings, in which.

DETAILED DESCRIPTION

Figure 1:
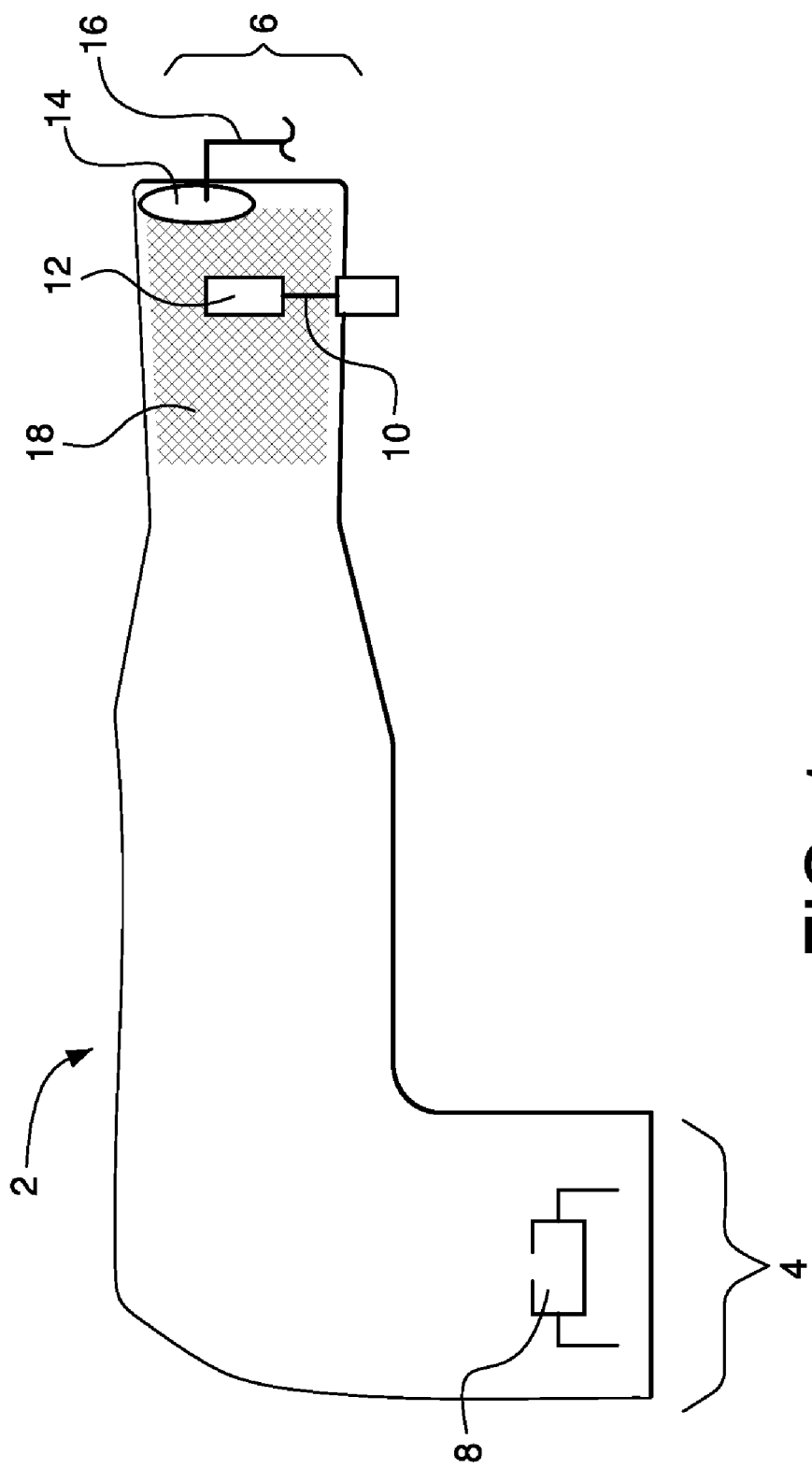
FIG. 1 is a schematic side-view of one example of a cleaning apparatus of the present invention.

Methods and apparatus for removing contaminants or debris from electrostatic chucks in processing chambers are provided.

In one aspect, a process is provided, the process comprising: flowing a backside gas comprising a reactive agent into a zone in a process chamber, the zone defined by a space between a surface of an electrostatic chuck and a surface of a substrate; and etching the surface of the electrostatic chuck with the reactive agent to remove debris. In one embodiment, the process further comprises applying a voltage to the electrostatic chuck. In another embodiment, the process further comprises treating the substrate with an ion beam.

In certain applications, the linear space that separates the surface of the electrostatic chuck and the surface of the substrate upon application of voltage to the echuck is less than approximately 10 µm deep. In some embodiments, the substrate has a diameter of approximately 300 mm.

In one embodiment, the reactive agent comprises an oxygen-containing gas. In a specific embodiment, the oxygen-containing gas is oxygen. In another example, the reactive agent comprises one or more halogens, i.e., chlorine, bromine, and fluorine. In other embodiments, it may be desirable to mix oxygen with at least one halogen. Further, the backside gas can comprise non-reactive materials, typically used in the prior art to cool substrates during ion implantation, such as argon, helium, nitrogen, or combinations thereof.

Generally, the backside gas is supplied at a pressure to ensure that the substrate remains in position relative to the electrostatic chuck. In one embodiment, the backside gas is supplied at a pressure of less than or equal to approximately 30 torr.

When the echuck is electrified, there is a relatively high electric field between the echuck and the substrate, and when oxygen is used as the reactive agent, the oxygen can be ionized into reactive species suitable for etching the electrostatic chuck in situ during processing. In one example, the oxygen is ionized into ozone. In another example, the oxygen is ionized into molecular oxygen. When it is desired, the substrate used can simply be a dummy substrate that is further discarded after the electrostatic chuck is cleaned. In other words, the substrate is not used to produce a product, but is instead used merely for a cleaning process.

According to one embodiment, an etch rate or removal rate of debris from the chuck is greater than a deposition rate of debris on the chuck such that debris does not accumulate on the echuck.

In another aspect of the present invention, a process that comprises moving an electrostatic chuck to a cleaning station within a process chamber, wherein a reactive agent source is operatively connected to the cleaning station; and etching a surface of the electrostatic chuck with a reactive agent to remove debris from the surface is provided. In this aspect, during ion implantation, the cleaning process is removed from the area where ion implantation into a substrate usually occurs and is done in a separate area of the same process chamber. In some embodiments, a voltage is applied to the electrostatic chuck.

In one example, the cleaning station comprises a cover that is approximately the same size as the electrostatic chuck. The process then further comprises positioning the electrostatic chuck in close alignment to the cover and flowing the reactive agent into a zone being defined by a space between the surface of the electrostatic chuck and a surface of the cover.

In other examples, after the electrostatic chuck is cleaned, the process further comprises moving the electrostatic chuck in position to receive a substrate. The process can then further comprise holding the substrate in position in close proximity to the electrostatic chuck and treating the substrate with an ion beam.

In a further aspect of the present invention, an apparatus for cleaning an electrostatic chuck is provided, the apparatus comprising: a process chamber; an elongate arm having a reach disposed through a wall of the process chamber; an electrostatic chuck attached to the elongate arm; a cleaning station located within the reach of the elongate arm; and a reactive gas source that is operatively connected to the cleaning station.

In the embodiment shown in FIG. 1, the cleaning station is associated with an ion implanter, which includes a vacuum chamber 2 having a first end 4 and a second end 6. The vacuum chamber 2 includes an ion beam source 8 located at the first end 4. An elongate arm 10 is located at the second end 6. An electrostatic chuck 12 is attached to the elongate arm 10. A cleaning station 14 is operatively coupled to a reactive gas source 16. The cleaning station 14 is located within a reach 18 (depicted, for example, by the textured area) of the elongate arm 10 so that the electrostatic chuck 12 can be moved by the elongate arm 10 into position at the cleaning station without the need to open the vacuum chamber. The reach of the elongate arm determines the location at which the arm 10 can physically place the electrostatic chuck 12.

Figure 2:
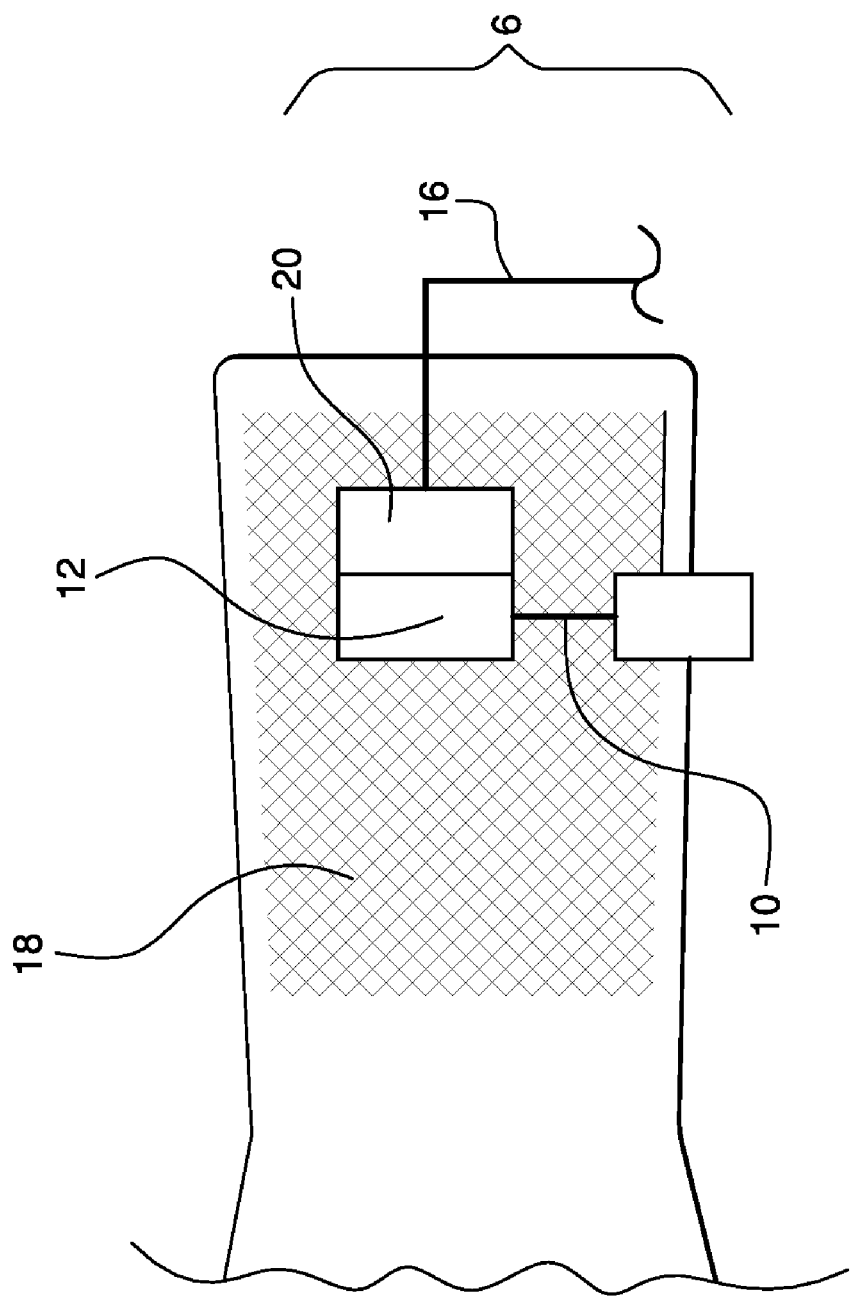
FIG. 2 is a schematic side-view of a portion of another example of a cleaning apparatus of the present invention.

In one example, as shown in FIG. 2, the elongate arm 10 is moved to position the electrostatic chuck 12 near a cleaning station defined by a cover 20 that is approximately the same size as the electrostatic chuck 12. A reactive gas source 16 in FIG. 2 is operatively connected to the cover. In operation, a valve from the reactive gas to the cover would open when the echuck was in proper position near the cover. Pressure of the reactive gas would be regulated to remain less than approximately 30 torr and the gas would flow for sufficient time to reduce the amount of debris or contamination on the echuck.

Figure 3:
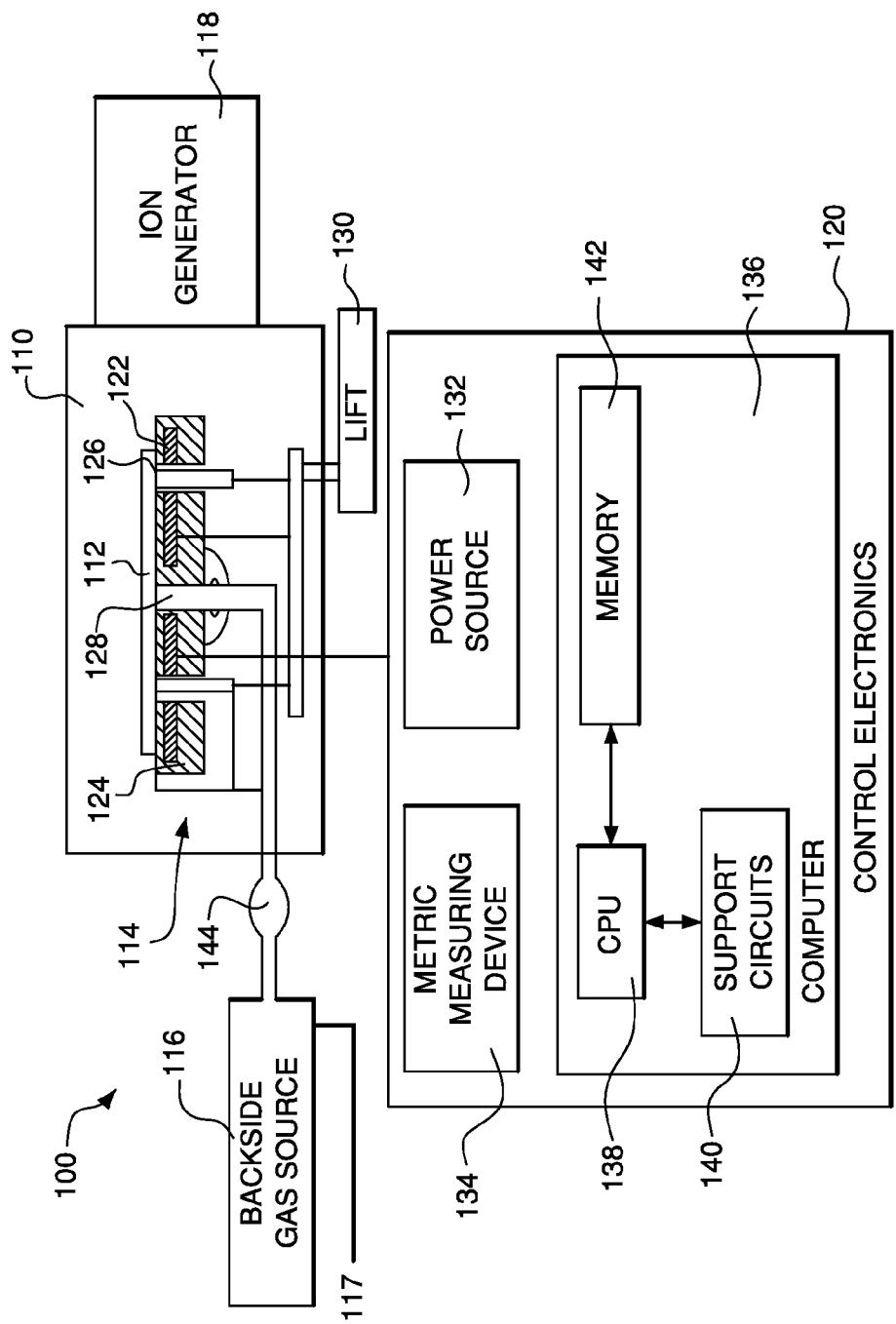
FIG. 3 is an exemplary application for aspects of the present invention within an ion implanter semiconductor wafer processing system.

FIG. 3 depicts an example of an ion implanter semiconductor wafer processing system 100 in accordance with one aspect of the present invention. The system 100 comprises a vacuum chamber 110, an ion generator 118, an electrostatic chuck 114, a backside gas source 116, and control electronics 120. Although the invention is described in an exemplary ion implant system, the invention is generally applicable to other semiconductor wafer processing systems wherever an electrostatic chuck is used to retain a wafer within a processing chamber. The backside gas can include any of the gases described immediately above.

An ion beam or other source of ions for implantation that is generated by the ion generator 118 is scanned horizontally while the wafer 112 is being displaced vertically such that all locations on the wafer 112 may be exposed to the ion beam. The electrostatic chuck 114 is disposed in the chamber 110. In this example, the electrostatic chuck 114 has a pair of coplanar electrodes 122 embedded within a chuck body 124 that forms a support surface 126 near which the electrostatic chuck 114 retains the wafer 112. The electrostatic chuck 114 produces an attraction force that is sufficient to permit the chuck to be rotated from a horizontal position to a vertical position without the wafer 112 moving across the support surface 126.

The chuck body 124 includes a passage 128 that permits a heat transfer gas or gases, such as helium, to be supplied from the backside gas source 116 to an interstitial space between the support surface 126 and the wafer 112 to promote heat transfer. A reactive agent source 117 can be piped into the backside gas source 116.

Other configurations of ion implanters are possible, and their chambers and/or backside gas sources are amenable to embodiments of the present invention. For example, U.S. Pat. No. 6,689,221, which is commonly assigned to Applied Materials, Inc. of Santa Clara, Calif. and which is incorporated herein by reference in its entirety, discloses a rotatable wafer support assembly (e.g., chuck) having a rotatable shaft coupled to the chuck and a housing disposed over the shaft. The shaft, housing, and a plurality of seals form part of a gas delivery system for providing a cooling gas (e.g., helium) to the wafer.

Another ion implanter is shown and discussed in U.S. Pat. No. 6,207,959, entitled "Ion Implanter" commonly assigned to Applied Materials, Inc. of Santa Clara, Calif., which is incorporated herein by reference in its entirety. U.S. Pat. No. 6,207,959 discloses an implanter with a scanning arm assembly enabling rotation of a wafer holder (e.g., electrostatic chuck) about the wafer axis. It is noted therein that a vacuum robot is provided in the chamber for removing processed wafers from the wafer holder (e.g., chuck) and delivering new wafers to the wafer holder. As such, in this exemplary ion implanter processing system, the lift pins and their respective lift pin passageways through the chuck, as well as a lift pin actuator 130 (illustratively shown in FIG. 3), are not required in such ion implanter semiconductor wafer processing system 100.

In the embodiment shown in FIG. 3, the control electronics 120 comprises a DC power supply 132, a metric measuring device 134, and a computer device 136. The DC power supply 132 provides a voltage to the electrodes 122 to retain (i.e., "chuck") the wafer 112 near to the surface 136 of the chuck. The chucking voltage provided by the power source 132 is controlled by the computer 136. The computer 136 is a general purpose, programmable computer system comprising a central processing unit (CPU) 138 connected to conventional support circuits 140 and to memory circuits 142, such as read-only memory (ROM) and random access memory (RAM). The computer 136 is also coupled to the metric measuring device 134, which is coupled to a flow sensor 144 of the gas supplied by the backside gas source 116. The computer 136 monitors and regulates the gas flow to the chuck in response to measurement readings from the flow sensor 144.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An apparatus for cleaning an electrostatic chuck, the apparatus comprising:
   a process chamber;
   an elongate arm having a reach, the elongate arm disposed through a wall of the process chamber;
   an electrostatic chuck attached to the elongate arm;
   a cleaning station comprising a cover, the cleaning station located in the process chamber and within reach of the elongate arm; and
   a reactive gas source connected to the cover of the cleaning station.

2. The apparatus of claim 1, wherein the reactive gas comprises oxygen, chlorine, fluorine, bromine, or combinations thereof.

3. The apparatus of claim 1, wherein the electrostatic chuck comprises a chuck body having a support surface and a passage.

4. The apparatus of claim 3, wherein the passage permits a backside gas to be supplied from a backside gas source to an interstitial space between the support surface and a wafer in contact with the support surface.

5. The apparatus of claim 4, wherein the backside gas is a heat transfer gas.

6. The apparatus of claim 4, wherein the backside gas is a reactive gas.

7. The apparatus of claim 1, wherein the cover of the cleaning station is approximately of same size as the electrostatic chuck.

8. The apparatus of claim 1, further comprising a valve from the reactive gas source to the cover.

9. The apparatus of claim 1, wherein electrostatic chuck does not have lift pins.

10. An apparatus comprising:
    a vacuum chamber having a first end and a second end;
    an ion beam source inside the vacuum chamber and located at the first end of the vacuum chamber;
    an elongate arm inside the vacuum chamber and located at the second end of the vacuum chamber; and
    a cleaning station inside the vacuum chamber and located within a reach of the elongate arm, the cleaning station comprising a cover connected to a reactive gas source.

11. The apparatus of claim 10, further comprising an electrostatic chuck attached to the elongate arm.

12. The apparatus of claim 10, wherein the electrostatic chuck can be moved by the elongate arm to a position adjacent the cleaning station without needing to open the vacuum chamber.

13. The apparatus of claim 10, wherein the cover is approximately of same size as the electrostatic chuck.

14. The apparatus of claim 10, further comprising a valve from the reactive gas source to the cover.

15. The apparatus of claim 10, wherein the electrostatic chuck comprises a pair of coplanar electrodes embedded within the chuck body.

16. The apparatus of claim 15, wherein the electrostatic chuck can be rotated from a horizontal position to a vertical position without a wafer moving across the support surface.

17. An apparatus comprising:
    a vacuum chamber having a first end and a second end;
    an ion beam source inside the vacuum chamber and located at the first end of the vacuum chamber;
    an elongate arm inside the vacuum chamber and located at the second end of the vacuum chamber, the elongate arm disposed through a wall of the vacuum chamber and having a reach;
    an electrostatic chuck attached to the elongate arm; and
    a cleaning station comprising a cover connected to a reactive gas source, the cleaning station located inside the vacuum chamber and located within the reach of the elongate arm.

* * * * *